United States Patent
Wu (10) Patent No.: US 8,699,003 B2
(45) Date of Patent: Apr. 15, 2014

(54) METHOD FOR DETERMINING ILLUMINATION SOURCE WITH OPTIMIZED DEPTH OF FOCUS

(75) Inventor: Chun-Wei Wu, New Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 336 days.

(21) Appl. No.: 13/154,450

(22) Filed: Jun. 7, 2011

(65) Prior Publication Data

US 2012/0314195 A1 Dec. 13, 2012

(51) Int. Cl.
*G03B 27/32* (2006.01)
*G03B 27/52* (2006.01)
*G03B 27/54* (2006.01)
*G03B 27/68* (2006.01)

(52) U.S. Cl.
USPC ............. 355/77; 355/52; 355/55; 355/67

(58) Field of Classification Search
USPC ........ 355/53, 55, 67–71, 77; 430/5, 8, 22, 30, 430/311, 312, 321, 322; 250/492.1, 492.2, 250/492.22, 493.1, 548; 716/53, 106
See application file for complete search history.

(56) References Cited

U.S. PATENT DOCUMENTS

| | | | | |
|---|---|---|---|---|
| 5,465,220 A * | 11/1995 | Haruki et al. | ................. | 347/256 |
| 5,680,588 A * | 10/1997 | Gortych et al. | ................. | 430/30 |
| 2004/0141167 A1* | 7/2004 | Sasaki | .............. | 355/67 |
| 2004/0158808 A1* | 8/2004 | Hansen | ........... | 716/21 |
| 2005/0153217 A1* | 7/2005 | Izuha et al. | ....................... | 430/5 |
| 2006/0046168 A1* | 3/2006 | Fukuhara | ........................ | 430/30 |
| 2006/0078806 A1* | 4/2006 | Hansen | .............. | 430/5 |
| 2006/0161452 A1* | 7/2006 | Hess | ................ | 705/1 |
| 2006/0199091 A1* | 9/2006 | Rosenbluth | .................... | 430/30 |

* cited by examiner

*Primary Examiner* — Toan Ton
*Assistant Examiner* — Christina Riddle
(74) *Attorney, Agent, or Firm* — Winston Hsu; Scott Margo (57) ABSTRACT

A method for determining an illumination source with optimized depth of focus includes the following steps. First, a simulated optimal correlation and a simulated defocus correlation of each illumination source are provided. Second, an optimal peak is determined, a defocus peak is determined, and an optimal correlation slope and a defocus correlation slope are determined. An optimal correlation ratio and a peak variation are calculated. A correlation variation is calculated from the optimal correlation ratio and the defocus correlation ratio. Next, a weighted variation is determined from the peak variation and the correlation variation. An illumination source of a lowest weighted variation among a plurality of the illumination sources is determined to be an illumination source with optimized depth of focus.

23 Claims, 13 Drawing Sheets

METHOD FOR DETERMINING ILLUMINATION SOURCE WITH OPTIMIZED DEPTH OF FOCUS

BACKGROUND OF THE INVENTION

1. Field of the Invention

The present invention relates to a method for determining an illumination source with optimized depth of focus. In particular, the present invention relates to a method for determining an illumination source with optimized depth of focus by calculating an optimal correlation ratio.

2. Description of the Prior Art

An image DOF (depth of focus) is an important index in lithography processes. When the DOF is too small, in-line process control will become very difficult. Accordingly, simulations are always done in advance to optimize the illumination sources for specific patterns because DOF is a highly decisive value for judgment. When there are thousands of possible source split conditions, analysis and determination of various possible simulation results becomes an arduous and heavy burden.

Figure 1:
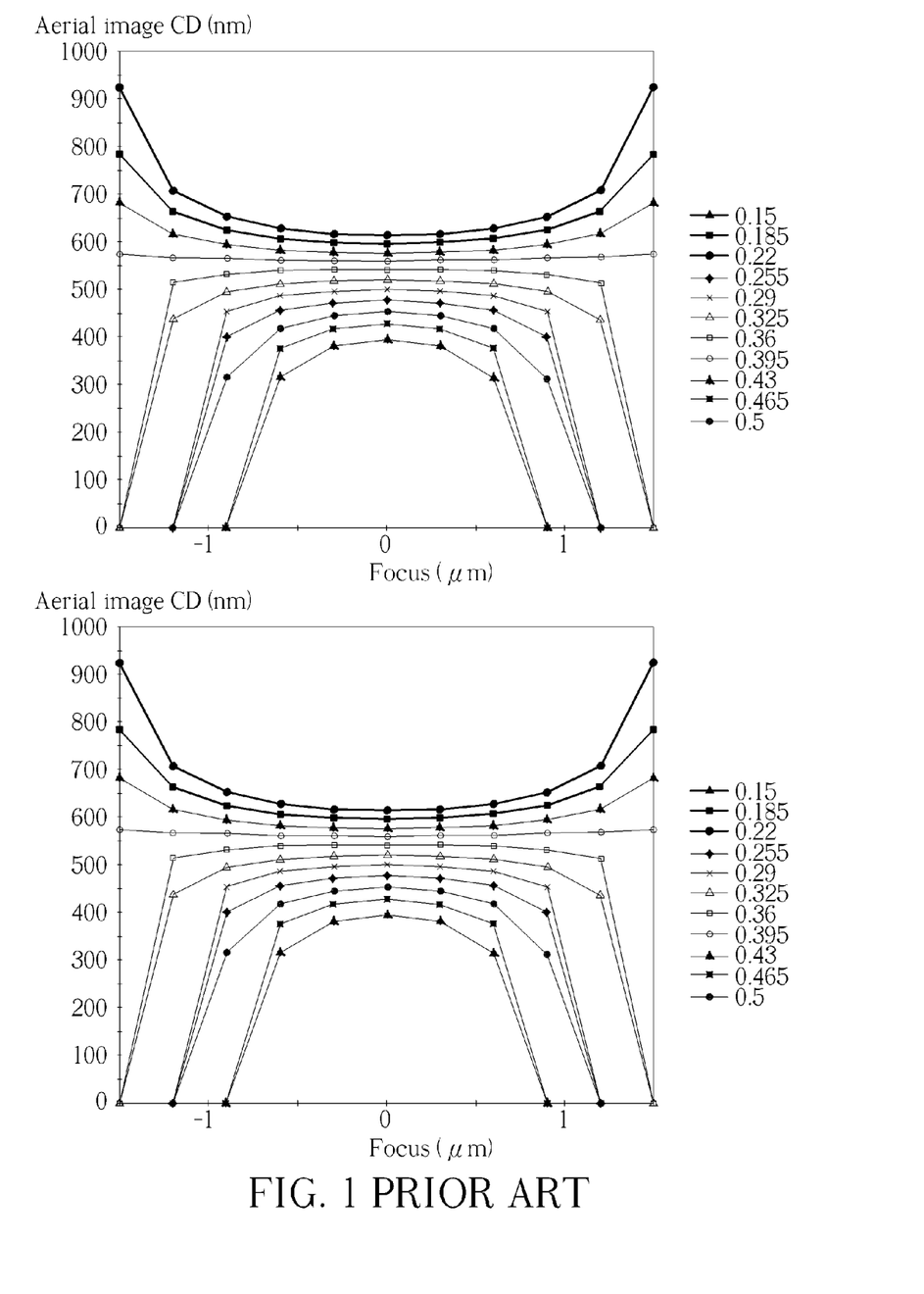
FIGS. 1-3 illustrate a conventional method.
Figure 2:
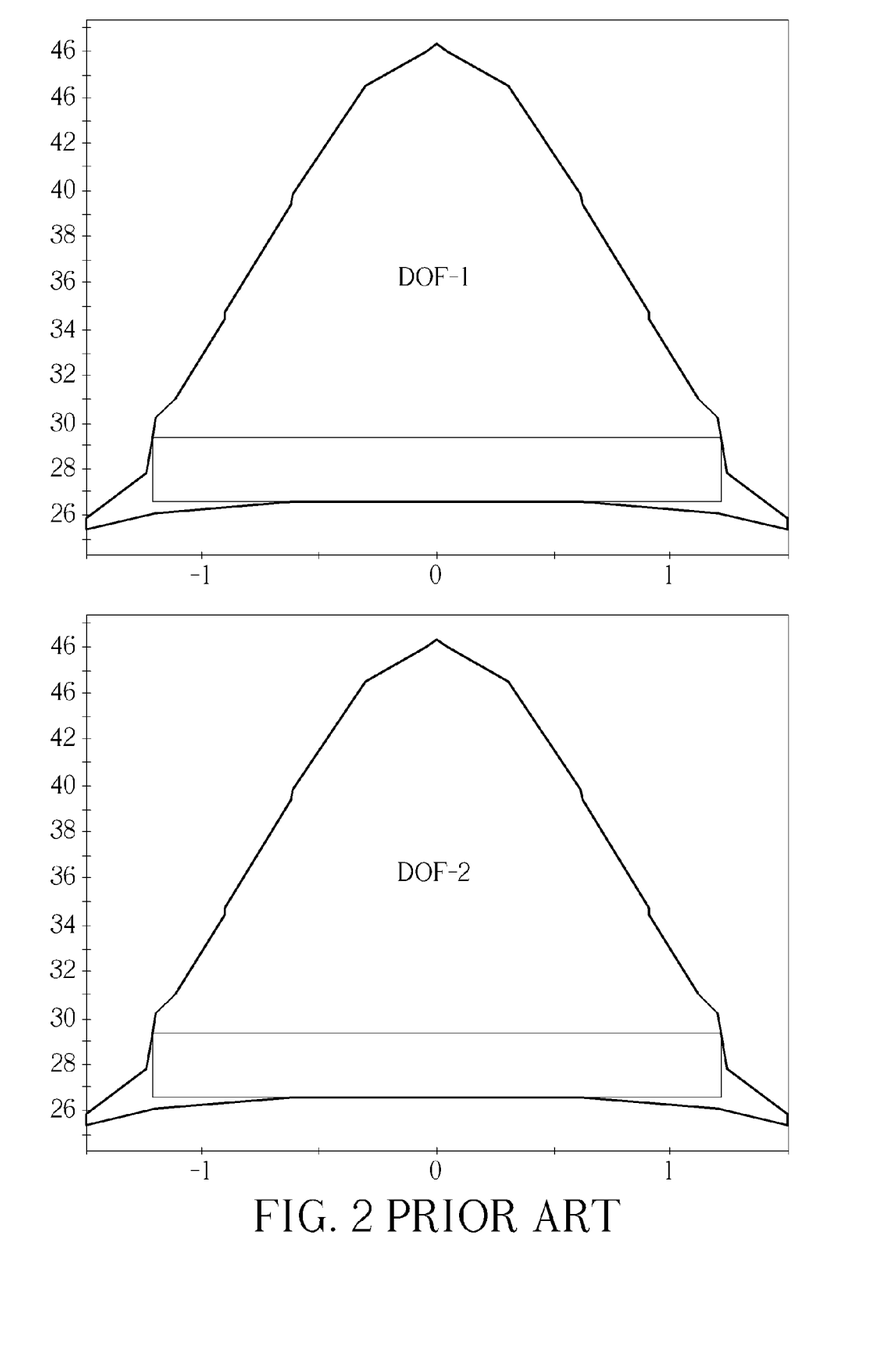

Every source condition has to perform a DOF calculation for judgment. As shown in FIG. 1, the DOF calculation involves an FEM (Focus-Energy-Matrix) simulation for obtaining a Bossung curve chart and then calculates a DOF value from the chart, as shown in FIG. 2. Simulated FEM data has to cover the specifications of CD target for getting complete DOF values. Because every source condition has different DOF values, the dose (threshold) and focus boundaries need to be determined for each condition in order for the FEM simulation to be carried out.

Figure 3:
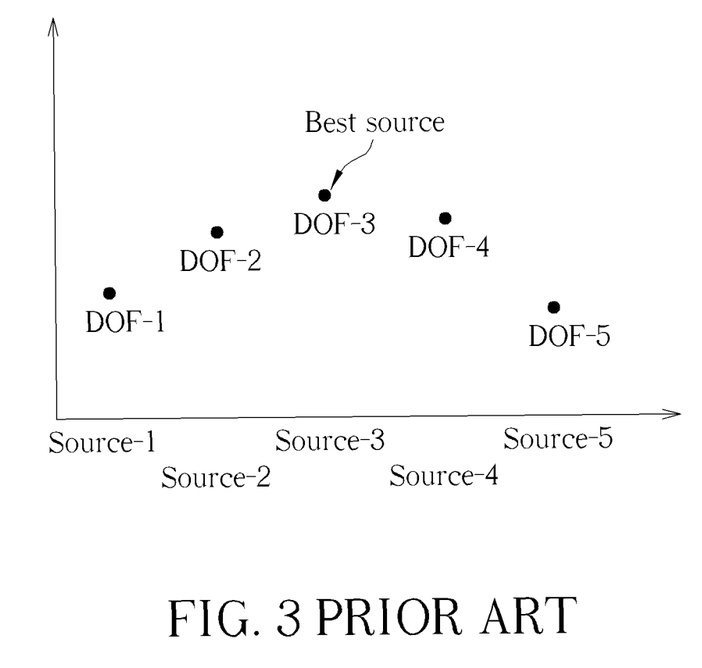

An FEM usually needs 5 to 10 splits for dose and focus individually to form a complete Bossung curve. The total number of simulation times is at least 25 to 100 for each source condition. In view of the above problems, a simpler approach is needed to determine an illumination source with an optimized depth of focus, as shown in FIG. 3.

SUMMARY OF THE INVENTION

Given the above, the present invention proposes a novel and simpler method for determining an illumination source with optimized depth of focus. The method of the present invention can reduce the complexity of collecting data for determining an illumination source with optimized depth of focus to a minimum.

The present invention in a first aspect proposes a method of the method for determining an illumination source with optimized depth of focus solely via a peak variation. First, a plurality of illumination sources are provided. Second, a simulated optimal correlation and a simulated defocus correlation of each of the illumination sources are provided. The simulated optimal correlation expresses an optimal intensity as a function of a position of a given illumination source and the simulated defocus correlation expresses a defocus intensity as a function of a position of the given illumination source. Then, an optimal peak is determined from the simulated optimal correlation and a defocus peak is determined from the simulated defocus correlation. A peak variation is calculated from the optimal peak and the defocus peak. Next, an illumination source of a lowest peak variation among a plurality of the illumination sources is determined to be an illumination source with optimized depth of focus.

In one embodiment of the present invention, the simulated optimal correlation is determined by a given photolithographic device.

In another embodiment of the present invention, the simulated defocus correlation is obtained by adjusting at least one photolithographic parameter of the given photolithographic device away from an optimal value.

In another embodiment of the present invention, at most two simulations are done to obtain the simulated optimal correlation and the simulated defocus correlation for each of the illumination sources.

In another embodiment of the present invention, the optimal peak of the simulated optimal correlation is the greatest optimal intensity of the simulated optimal correlation.

In another embodiment of the present invention, the defocus peak of the simulated optimal correlation is the greatest defocus intensity of the simulated optimal correlation.

In another embodiment of the present invention, the peak variation is calculated from the following formula:

$$\text{Peak Variation} = (\text{Optimal Peak} - \text{Defocus Peak})/(\text{Optimal Peak}).$$

The present invention in a second aspect proposes a method for determining an illumination source with optimized depth of focus solely by a correlation variation. First, a plurality of illumination sources are provided. Second, a simulated optimal correlation and a simulated defocus correlation of each of the illumination sources are provided. The simulated optimal correlation expresses an optimal intensity as a function of a position of a given illumination source and the simulated defocus correlation expresses a defocus intensity as a function of a position of the given illumination source. Then, an optimal correlation slope and a defocus correlation slope are determined from the given illumination source. The optimal correlation slope represents the slope of the simulated optimal correlation at a given dimension, and the defocus correlation slope represents the slope of the simulated defocus correlation at a given dimension. Later, an optimal correlation ratio is calculated from the optimal correlation slope and a defocus correlation ratio is calculated from the defocus correlation slope. Next, a correlation variation is calculated from the optimal correlation ratio and the defocus correlation ratio. Afterwards, an illumination source of a lowest correlation variation among a plurality of the illumination sources is determined to be an illumination source with optimized depth of focus.

In one embodiment of the present invention, the simulated optimal correlation is determined by a given photolithographic device.

In another embodiment of the present invention, the simulated defocus correlation is obtained by adjusting at least one photolithographic parameter of the given photolithographic device away from an optimal value.

In another embodiment of the present invention, at most two simulations are done to obtain the simulated optimal correlation and the simulated defocus correlation for each of the illumination sources.

In another embodiment of the present invention, the given dimension is a critical dimension of a semiconductor device.

In another embodiment of the present invention, the optimal correlation ratio is calculated from the following formula:

$$\text{Optimal Correlation Ratio} = (\text{Optimal Correlation Slope})/(\text{Optimal Intensity}).$$

In another embodiment of the present invention, the defocus correlation ratio is calculated from the following formula:

$$\text{Defocus Correlation Ratio} = (\text{Defocus Correlation Slope})/(\text{Defocus Intensity}).$$

In another embodiment of the present invention, the correlation variation is calculated from the following formula:

Correlation Variation=(Optimal Correlation Ratio−Defocus Correlation Ratio)/(Optimal Correlation Ratio).

The present invention in a first aspect proposes a method for determining an illumination source with optimized depth of focus by a peak variation and a correlation variation. First, a plurality of illumination sources are provided. Second, a simulated optimal correlation and a simulated defocus correlation of each of the illumination sources are provided. The simulated optimal correlation expresses an optimal intensity as a function of a position of a given illumination source and the simulated defocus correlation expresses a defocus intensity as a function of a position of the given illumination source. Then, an optimal peak is determined from the simulated optimal correlation, a defocus peak is determined from the simulated defocus correlation, and an optimal correlation slope of the given illumination source and a defocus correlation slope is determined from the given illumination source. The optimal correlation slope represents the slope of the simulated optimal correlation at a given dimension, and the defocus correlation slope represents the slope of the simulated defocus correlation at a given dimension. An optimal correlation ratio is calculated from the optimal correlation slope and a defocus correlation ratio is calculated from the defocus correlation slope. Also, a peak variation is calculated from the optimal peak and the defocus peak. A correlation variation is calculated from the optimal correlation ratio and the defocus correlation ratio. Next, a weighted variation is determined from the peak variation and the correlation variation. Afterwards, an illumination source of a lowest weighted variation among a plurality of the illumination sources is determined to be an illumination source with optimized depth of focus.

In one embodiment of the present invention, at most two simulations are done to obtain the simulated optimal correlation and the simulated defocus correlation for each of the illumination sources.

In another embodiment of the present invention, the peak variation is calculated from the following formula:

Peak Variation=(Optimal Peak−Defocus Peak)/(Optimal Peak).

In another embodiment of the present invention, the given dimension is a critical dimension of a semiconductor device.

In another embodiment of the present invention, the optimal correlation ratio is calculated from the following formula:

Optimal Correlation Ratio=(Optimal Correlation Slope)/(Optimal Intensity).

In another embodiment of the present invention, the defocus correlation ratio is calculated from the following formula:

Defocus Correlation Ratio=(Defocus Correlation Slope)/(Defocus Intensity).

In another embodiment of the present invention, the correlation variation is calculated from the following formula:

Correlation Variation=(Optimal Correlation Ratio−Defocus Correlation Ratio)/(Optimal Correlation Ratio).

In another embodiment of the present invention, the weighted variation is calculated from the following formula:

Weighted Variation=(Peak Variation*Peak Weight)+(Correlation Variation*Correlation Weight).

In another embodiment of the present invention, the peak weight+the correlation weight=1.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a shortcut for determining an illumination source with optimized depth of focus. In the method of the present invention, an illumination source with optimized depth of focus may be determining by calculating at least one of an optimal correlation ratio from an optimal correlation slope and a defocus correlation ratio from a defocus correlation slope. The method of the present invention can reduce the complexity of collecting the data for determining an illumination source with optimized depth of focus to a minimum.

Please refer to FIGS. 4A-9, which illustrate one possible embodiment of the method of the present invention. In the method of the present invention for determining an illumination source with optimized depth of focus, a plurality of illumination sources are provided. One of the illumination sources will be determined by the present invention to be an illumination source with optimized depth of focus. Suitable illumination sources may have smaller image deformations at defocus.

Figure 4A:
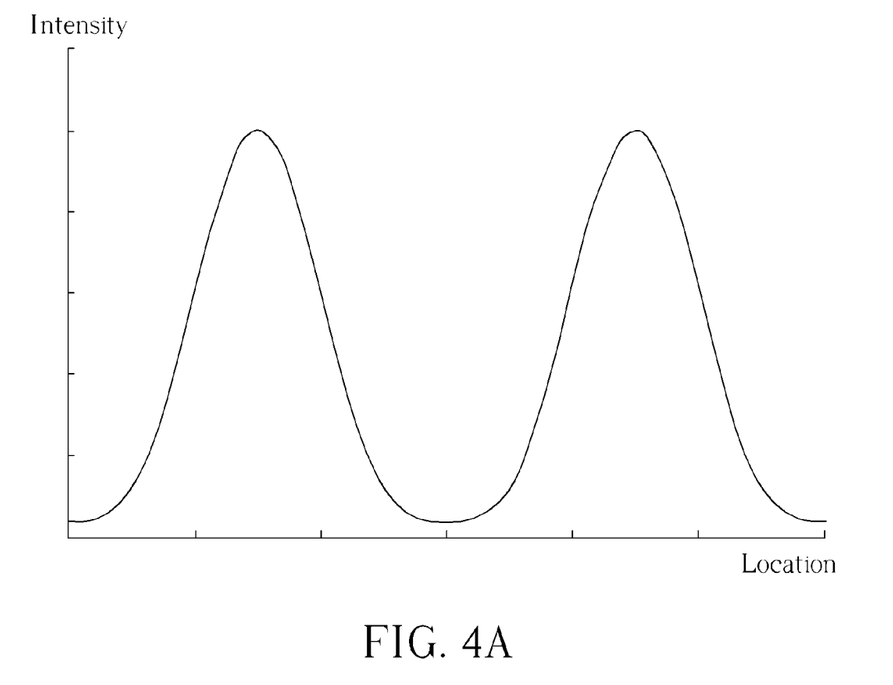
FIGS. 4A and 4B respectively illustrate an example of the simulated optimal correlation and the simulated defocus correlation of one demonstrative candidate illumination source.
Figure 4B:
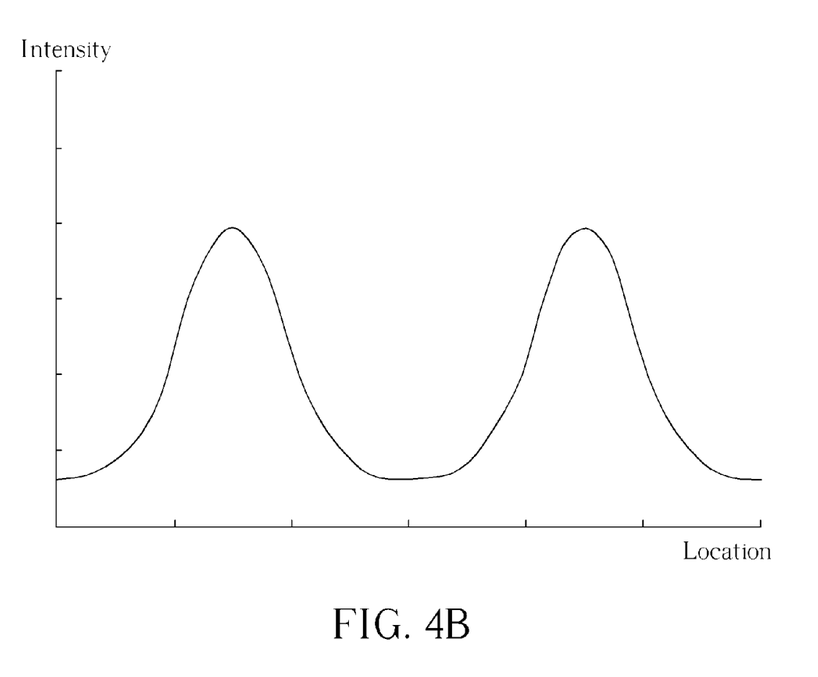

Second, each of the candidate illumination sources undergo various tests including imaging simulations at best focus and defocus wherein principle in imaging simulations refers to Abbe imaging theory to provide a corresponding simulated optimal correlation, as shown in FIG. 4A, and a corresponding simulated defocus correlation, as shown in FIG. 4B. The simulated optimal correlation in one aspect expresses an optimal intensity as a function of a position of a given illumination source. In another aspect, the simulated defocus correlation expresses a defocus intensity as a function of a position of said given illumination source. It is one of the features of the present invention that, at most, two simulations are needed to obtain the simulated optimal correlation and the simulated defocus correlation for each of the illumination sources.

FIGS. 4A and 4B respectively illustrate an example of the simulated optimal correlation and the simulated defocus correlation of one demonstrative candidate illumination source. For example, the simulated optimal correlation is determined by a given photolithographic device, such as straight lines arranged in parallel with a pitch. The simulated defocus correlation is obtained by adjusting at least one photolithographic parameter of the given photolithographic device away from an optimal value. These optimal photolithographic parameters are usually already known.

Figure 5A:
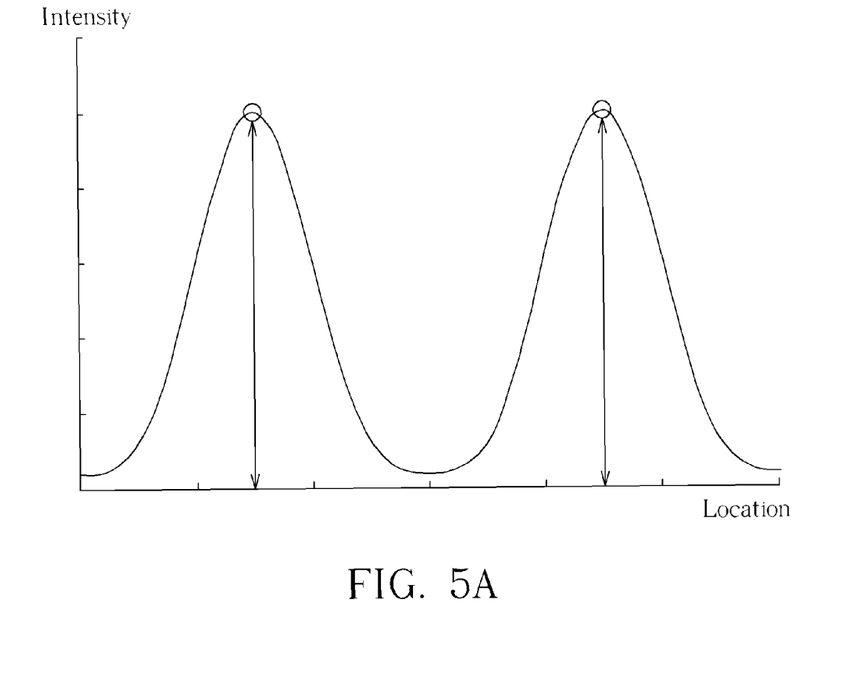
FIGS. 5A and 5B respectively illustrate an example of the simulated optimal correlation and the simulated defocus correlation of one demonstrative candidate illumination source.
Figure 5B:
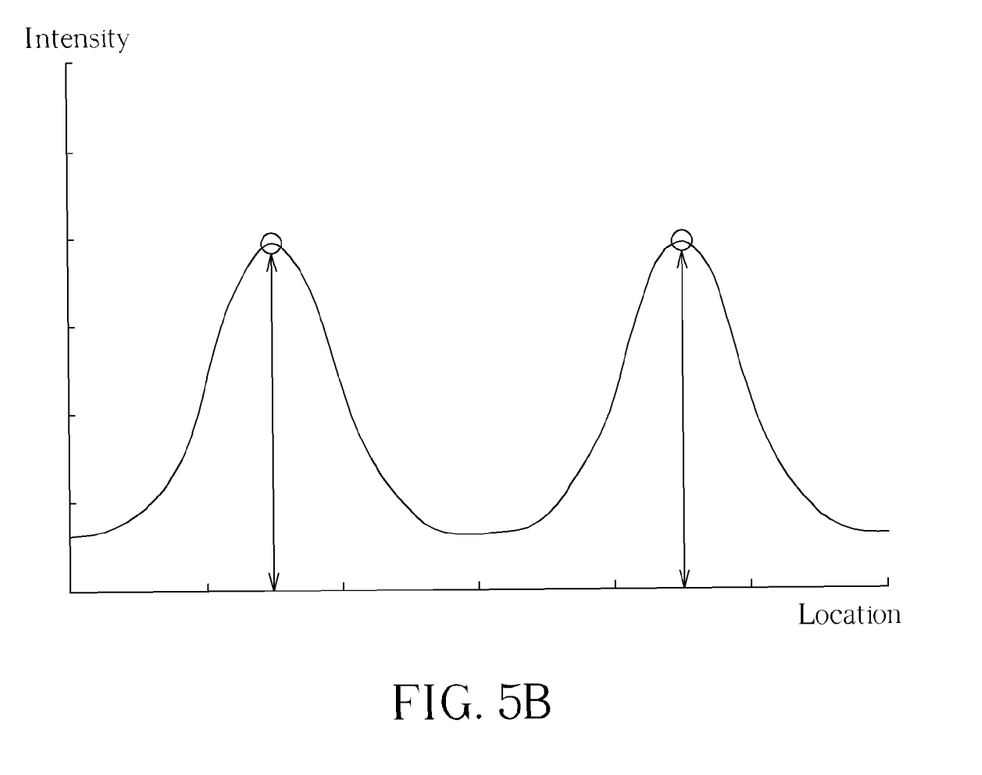

Next, as shown in FIG. 3, different parameters in the simulated optimal correlation and in the simulated defocus correlation are respectively determined. The parameters may come from the curve itself or the slope of the curve. For example, as shown in FIG. 5A, in one aspect an optimal peak is one point located in the curve of the simulated optimal correlation. The optimal peak of the simulated optimal correlation is the greatest optimal intensity of the simulated optimal correlation. In another aspect, as shown in FIG. 5B, a defocus peak is one point located in the curve of the simulated defocus correlation. The defocus peak of the simulated optimal correlation is the greatest defocus intensity of the simulated optimal correlation.

Figure 6A:
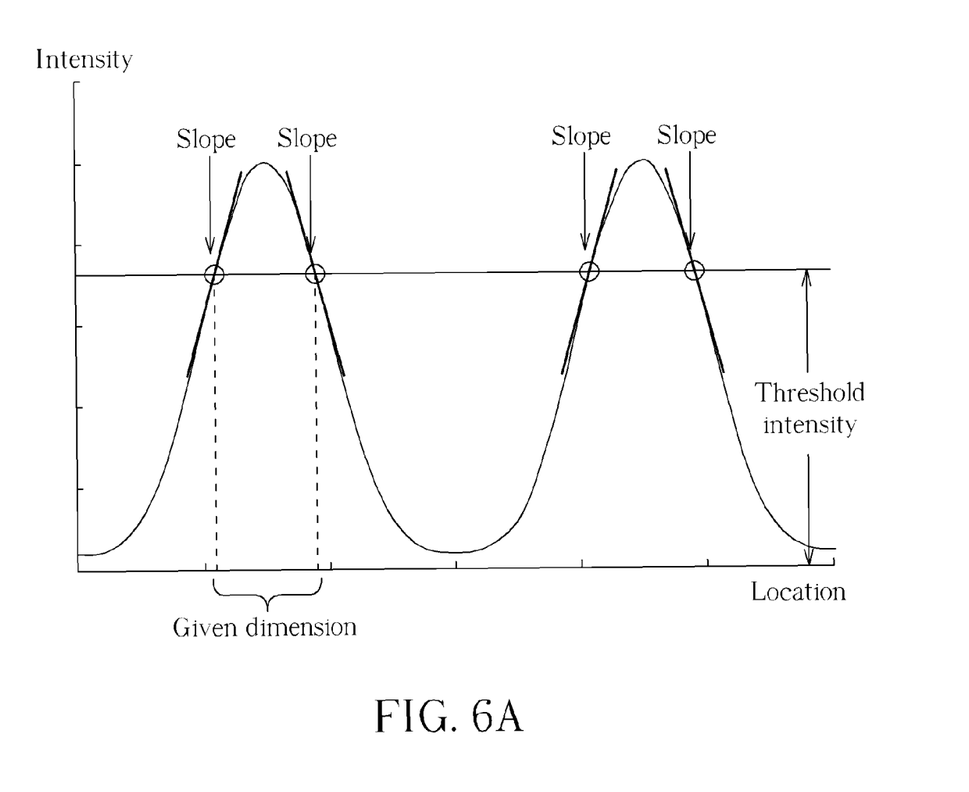
FIGS. 6A and 6B respectively illustrate an example of the simulated optimal correlation and the simulated defocus correlation of one demonstrative candidate illumination source.
Figure 6B:
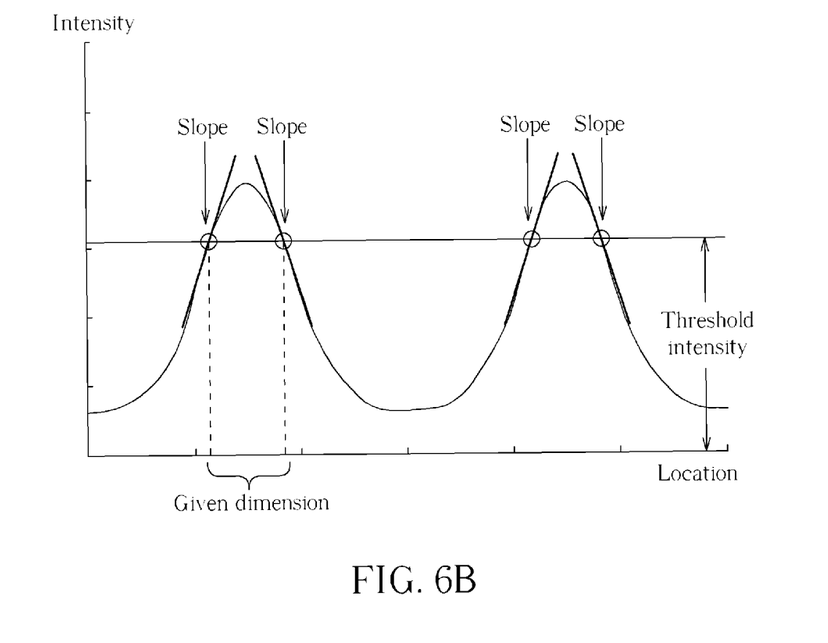

As shown in FIG. 6A, an optimal correlation slope of a given illumination source at a certain intensity threshold is calculated. In another aspect, as shown in FIG. 6B, a defocus correlation slope of the given illumination source at a certain intensity threshold is calculated from the simulated defocus correlation. The optimal correlation slope represents the slope of the simulated optimal correlation at a given dimension, and the defocus correlation slope represents the slope of the simulated defocus correlation at a given dimension. Each parameter may be determined by the principle of calculus. The intensity threshold usually means the minimum photo intensity to start a photo-initiation reaction in a photoresist. The given dimension is a critical dimension of a semiconductor device. For example of forming pattern process by positive resist and positive development, as photoresist with intensity higher than the threshold, it may be dissolved out by following development procedure. Then pattern composed of photoresist is formed based on left photoresist area and dissolved area.

Figure 7A:
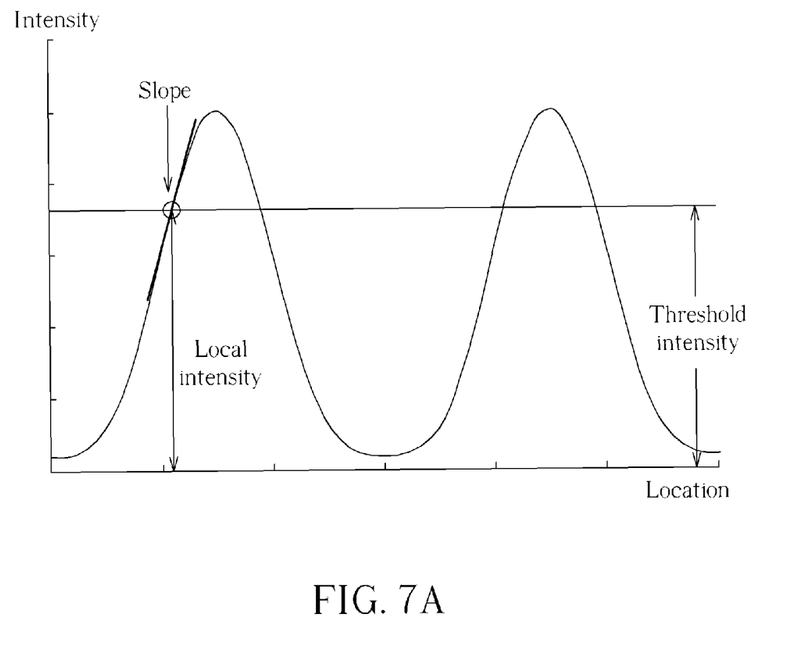
FIGS. 7A and 7B respectively illustrate an example of the simulated optimal correlation and the simulated defocus correlation of one demonstrative candidate illumination source.

An optimal correlation ratio is then calculated from the optimal correlation slope. Similarly, a defocus correlation ratio is calculated from the defocus correlation slope. As shown in FIG. 7A, the optimal correlation ratio is a ratio of the optimal correlation slope with respect to the intensity at the same point, namely a local intensity at a given dimension. The optimal correlation ratio may be represented by the following formula:

Optimal Correlation Ratio=optimal correlation slope/local intensity.

For example, if optimal slope equals to 7.5 (unit=1/um) and local intensity equals to 0.50, then Optimal Correlation Ratio is 15 (unit=1/um) which is from calculation of 7.5 divided by 0.50.

Figure 7B:
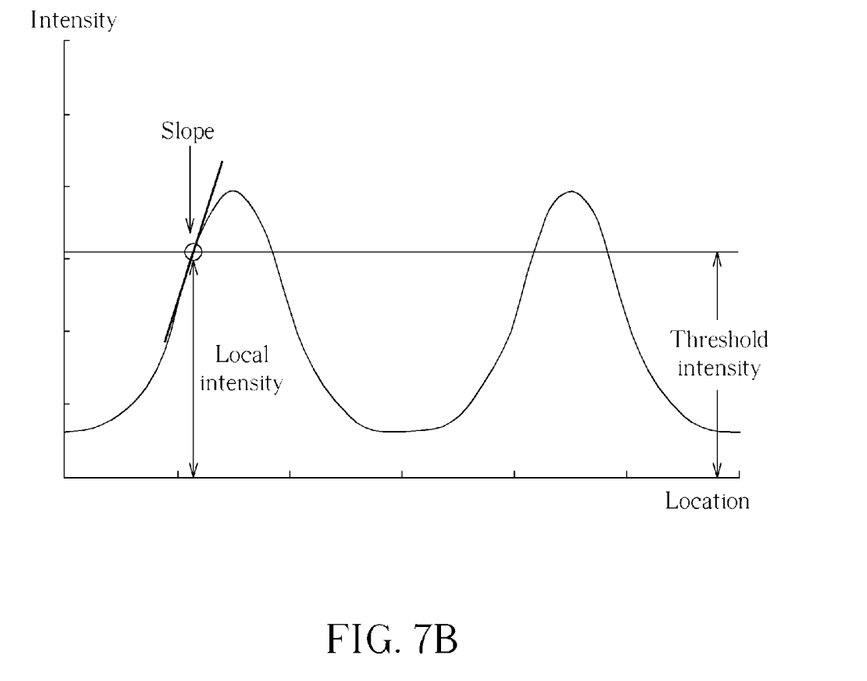
Figure 8:
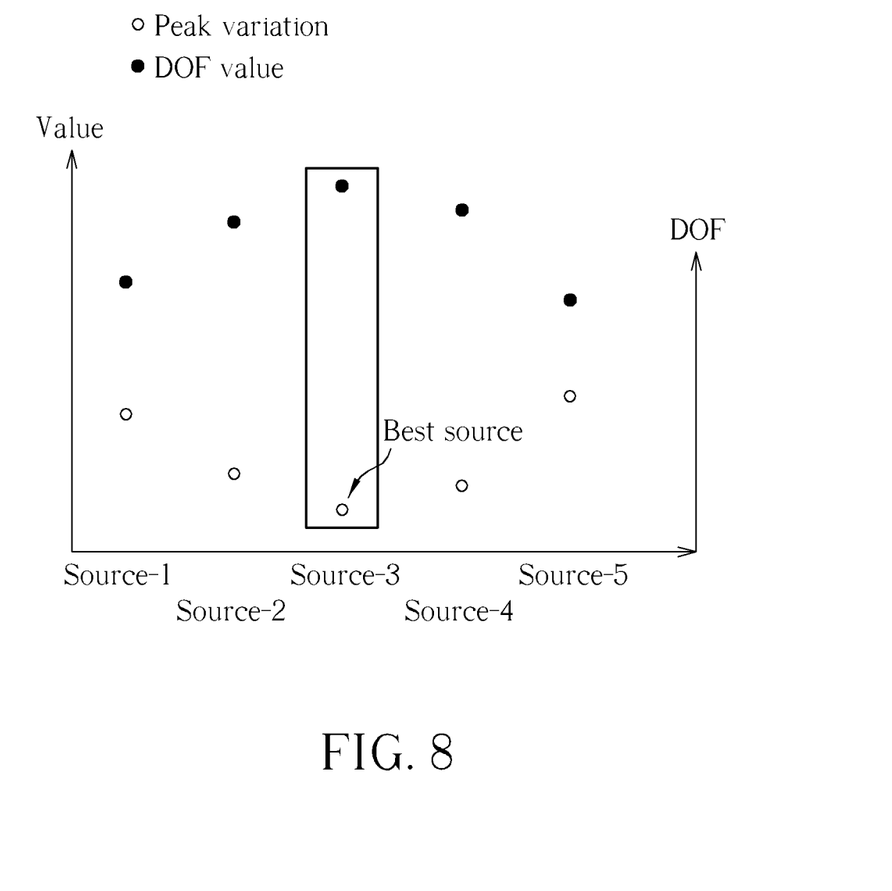
FIGS. 8-9 respectively illustrate an example of the correlation of one demonstrative candidate illumination source of the present invention.

Similarly, as shown in FIG. 7B, the defocus correlation ratio is a ratio of the defocus correlation slope with respect to the intensity at the same point, namely a local intensity at a given dimension. The defocus correlation ratio may be represented by the following formula:

Defocus Correlation Ratio=defocus correlation slope/local intensity.

For example, if optimal slope equals to 6.0 (unit=1/um) and local intensity equals to 0.50, then Defocus Correlation Ratio is 12 (unit=1/um) which is from calculation of 6.0 divided by 0.50.

Further, a correlation variation from the previously obtained optimal correlation ratio and from the previously obtained defocus correlation ratio is calculated. The correlation variation is a ratio of the difference of the previously obtained optimal correlation ratio and the previously obtained defocus correlation ratio with respect to the previously obtained optimal correlation ratio. The correlation variation may be represented by the following formula:

Correlation Variation=(optimal correlation ratio−defocus correlation ratio)/optimal correlation ratio For example, if optimal correlation ratio equals to 15 and defocus correlation ratio equals to 12, then Correlation Variation is 0.20 which is from the calculation of (15-12)/15.

Please note that the optimal correlation ratio is always more than the defocus correlation ratio.

Similarly, a peak variation is calculated from the optimal peak and from the defocus peak. The peak variation is a ratio of the difference of the optimal peak value and the defocus peak value with respect to optimal peak value. The peak variation may be represented by the following formula:

Peak Variation=(optimal peak value−defocus peak value)/optimal peak value.

For example, if optimal peak value equals to 0.80 and defocus peak value equals to 0.60, then Peak Variation is 0.25 which is from the calculation of (0.80−0.60)/0.80.

Please note that the optimal correlation ratio is always more than the defocus correlation ratio.

Later, once the Peak Variation and the Correlation Variation of each candidate illumination source are obtained, an illumination source with an optimized depth of focus can be determined from those parameters. To illustrate one embodiment of the present invention, please refer to FIG. 8. The illumination source with an optimized depth of focus can be determined from the parameters of the peak variation alone. The illumination source with an optimized depth of focus is the illumination source with the smallest peak variation value. For example, if peak variations of Source-1, Source-2, Source-3, Source-4 and Source-5 are 0.30, 0.25, 0.20, 0.25 and 0.30 respectively, then Source-3 has better depth of focus due to its peak variation is smallest.

Figure 9:
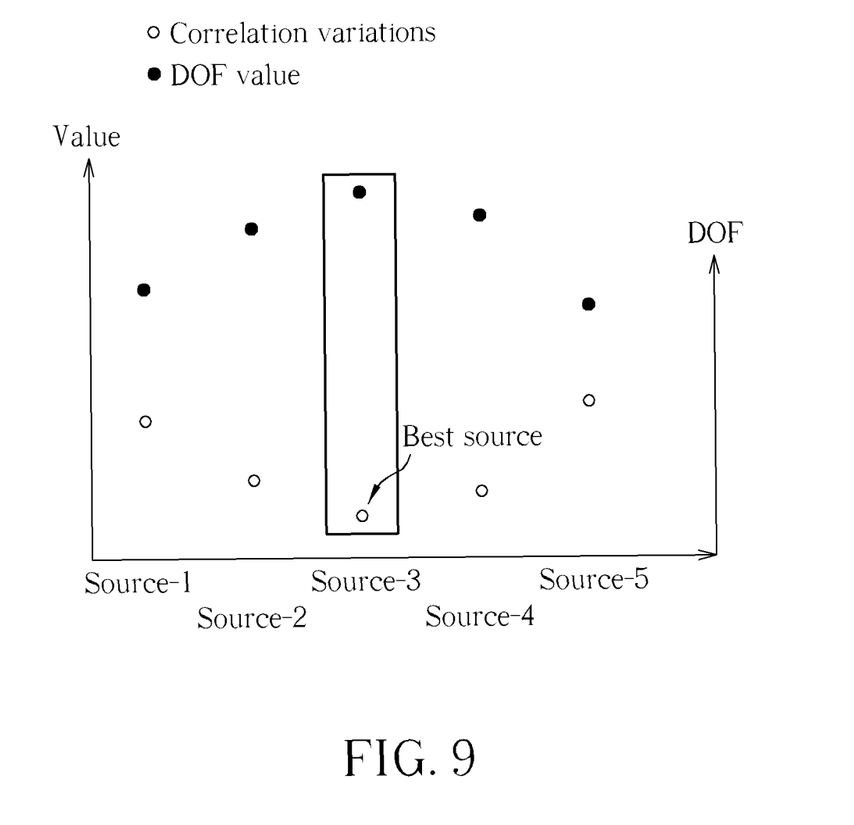

To illustrate another embodiment of the present invention, please refer to FIG. 9. The illumination source with an optimized depth of focus can be determined from the parameters of the correlation variation alone. The illumination source with an optimized depth of focus is the illumination source with the smallest correlation variation value. For example, if correlation variations of Source-1, Source-2, Source-3, Source-4 and Source-5 are 0.35, 0.30, 0.25, 0.30 and 0.35 respectively, then Source-3 has better depth of focus due to its correlation variation is smallest.

In still another embodiment of the present invention, the illumination source with an optimized depth of focus is dependent upon the parameters of both the correlation variation as well as the peak variation. The illumination source with an optimized depth of focus is related to the smallest possible value of the correlation variation value in view of the peak variation. In other words, the possible value is a weighted variation and related to both the correlation variation value and the peak variation.

The percentage of the contribution of the correlation variation value and the peak variation to the total possible value is represented by a set of weight values, namely a peak weight and a correlation weight. For example, the peak weight may be any number greater than 0 and less than 1 and the correlation weight may also be any number greater than 0 and less than 1 as long as the sum of the peak weight and the correlation weight is always 100%. For example, the peak weight is 0.5 (50%) and the correlation weight is 0.5 (50%).

The weighted variation may be presented by the following formula:

Weighted Variation=(peak variation*peak weight)+ (correlation variation*correlation weight);peak weight+correlation weight=1

The values of the peak weight and the correlation weight are at the discretion of and determined by persons who practice the present invention. For example, as importance of correlation variation is thought as the same to peak variation, then correlation weight is set to be 0.5 and correlation weight is 0.5, too. Therefore, as Source-1 condition has 0.30 and 0.35 for correlation and peak variation respectively, its Weighted Variation is 0.325 from the calculation of (0.30×0.5+0.35×0.5). Source-2 condition has 0.25 and 0.30 for correlation and peak variation respectively, its Weighted Variation is 0.275 from the calculation of (0.25×0.5+0.30×0.5). Source-3 condition has 0.20 and 0.25 for correlation and peak variation respectively, its Weighted Variation is 0.225 from the calculation of (0.30×0.5+0.35×0.5). Source-4 condition has 0.25 and 0.30 for correlation and peak variation respectively, its Weighted Variation is 0.275 from the calculation of (0.25×0.5+0.30×0.5). Source-5 condition has 0.30 and 0.35 for correlation and peak variation respectively, its Weighted Variation is 0.325 from the calculation of (0.30×0.5+0.35×0.5). Based on this result, Source-3 has better depth of focus due to its weighted variation is smallest.

Those skilled in the art will readily observe that numerous modifications and alterations of the device and method may be made while retaining the teachings of the invention.

What is claimed is:

1. A method for determining an illumination source with optimized depth of focus, comprising:
    providing a plurality of illumination sources;
    providing a simulated optimal correlation and a simulated defocus correlation of each of said illumination sources, wherein said simulated optimal correlation expresses an optimal intensity as a function of a position of a given illumination source and said simulated defocus correlation expresses a defocus intensity as a function of a position of said given illumination source, wherein said defocus intensity is an intensity of each of said illumination source at defocus;
    determining an optimal peak of said simulated optimal correlation and a defocus peak of said simulated defocus correlation;
    calculating a peak variation of said optimal peak and said defocus peak, wherein said peak variation is calculated from the following formula:

said peak variation=(said optimal peak−said defocus peak)/(said optimal peak); and determining an illumination source of a lowest peak variation among a plurality of said illumination sources to be an illumination source with optimized depth of focus.

2. The method for determining an illumination source with optimized depth of focus of claim 1, wherein said simulated optimal correlation is determined by a given photolithographic device.

3. The method for determining an illumination source with optimized depth of focus of claim 2, wherein said simulated defocus correlation is obtained by adjusting at least one photolithographic parameter of said given photolithographic device away from an optimal value.

4. The method for determining an illumination source with optimized depth of focus of claim 1, wherein at most two simulations are done to obtain said simulated optimal correlation and said simulated defocus correlation for each of said illumination sources.

5. The method for determining an illumination source with optimized depth of focus of claim 1, wherein said optimal peak of said simulated optimal correlation is the greatest optimal intensity of said simulated optimal correlation.

6. The method for determining an illumination source with optimized depth of focus of claim 1, wherein said defocus peak of said simulated optimal correlation is the greatest defocus intensity of said simulated optimal correlation.

7. A method for determining an illumination source with optimized depth of focus, comprising:
    providing a plurality of illumination sources,
    providing a simulated optimal correlation and a simulated defocus correlation of each of said illumination sources, wherein said simulated optimal correlation expresses an optimal intensity as a function of a position of a given illumination source and said simulated defocus correlation expresses a defocus intensity as a function of a position of said given illumination source, wherein said defocus intensity is an intensity of each of said illumination sources at defocus;
    determining an optimal correlation slope and a defocus correlation slope of said given illumination source, wherein said optimal correlation slope represents the slope of said simulated optimal correlation at a given dimension, and said defocus correlation slope represents the slope of said simulated defocus correlation at a given dimension;
    calculating an optimal correlation ratio from said optimal correlation slope and a defocus correlation ratio from said defocus correlation slope;
    calculating a correlation variation of said optimal correlation ratio and said defocus correlation ratio; and
    determining an illumination source of a lowest correlation variation among a plurality of said illumination sources to be an illumination source with optimized depth of focus.

8. The method for determining an illumination source with optimized depth of focus of claim 7, wherein said simulated optimal correlation is determined by a given photolithographic device.

9. The method for determining an illumination source with optimized depth of focus of claim 8, wherein said simulated defocus correlation is obtained by adjusting at least one photolithographic parameter of said given photolithographic device away from an optimal value.

10. The method for determining an illumination source with optimized depth of focus of claim 7, wherein at most two simulations are done to obtain said simulated optimal correlation and said simulated defocus correlation for each of said illumination sources.

11. The method for determining an illumination source with optimized depth of focus of claim 7, wherein said given dimension is a critical dimension of a semiconductor device.

12. The method for determining an illumination source with optimized depth of focus of claim 7, wherein said optimal correlation ratio is calculated from the following formula:

said optimal correlation ratio=(said optimal correlation slope)/(said optimal intensity at said given dimension).

13. The method for determining an illumination source with optimized depth of focus of claim 7, wherein said defocus correlation ratio is calculated from the following formula:

said defocus correlation ratio=(said defocus correlation slope)/(said defocus intensity at said given dimension).

14. The method for determining an illumination source with optimized depth of focus of claim 7, wherein said correlation variation is calculated from the following formula:

said correlation variation=(said optimal correlation ratio−said defocus correlation ratio)/(said optimal correlation ratio).

15. A method for determining an illumination source with an optimized depth of focus, comprising:
providing a plurality of illumination sources;
providing a simulated optimal correlation and a simulated defocus correlation of each of said illumination sources, wherein said simulated optimal correlation expresses an optimal intensity as a function of a position of a given illumination source and said simulated defocus correlation expresses a defocus intensity as a function of a position of said given illumination source, wherein said defocus intensity is an intensity of each of said illumination source at defocus;
determining an optimal peak of said simulated optimal correlation, a defocus peak of said simulated defocus correlation, an optimal correlation slope of said given illumination source, and a defocus correlation slope of said given illumination source, wherein said optimal correlation slope represents the slope of said simulated optimal correlation at a given dimension, and said defocus correlation slope represents the slope of said simulated defocus correlation at a given dimension;
calculating an optimal correlation ratio from said optimal correlation slope and a defocus correlation ratio from said defocus correlation slope;
calculating a peak variation of said optimal peak and said defocus peak, a correlation variation of said optimal correlation ratio and said defocus correlation ratio;
determining a weight variation from said peak variation and said correlation variation; and
determining an illumination source of a lowest weighted variation among a plurality of said illumination sources to be an illumination source with optimized depth of focus.

16. The method for determining an illumination source with optimized depth of focus of claim 15, wherein at most two simulations are done to obtain said simulated optimal correlation and said simulated defocus correlation for each of said illumination sources.

17. The method for determining an illumination source with optimized depth of focus of claim 15, wherein said peak variation is calculated from the following formula:

said peak variation=(said optimal peak−said defocus peak)/(said optimal peak).

18. The method for determining an illumination source with optimized depth of focus of claim 15, wherein said given dimension is a critical dimension of a semiconductor device.

19. The method for determining an illumination source with optimized depth of focus of claim 15, wherein said optimal correlation ratio is calculated from the following formula:

said optimal correlation ratio=(said optimal correlation slope)/(said optimal intensity at said given dimension).

20. The method for determining an illumination source with optimized depth of focus of claim 15, wherein said defocus correlation ratio is calculated from the following formula:

said defocus correlation ratio=(said defocus correlation slope)/(said defocus intensity at said given dimension).

21. The method for determining an illumination source with optimized depth of focus of claim 15, wherein said correlation variation is calculated from the following formula:

said correlation variation=(said optimal correlation ratio−said defocus correlation ratio)/(said optimal correlation ratio).

22. The method for determining an illumination source with optimized depth of focus of claim 15, wherein said weighted variation is calculated from the following formula:

said weighted variation=(said peak variation*a peak weight)+(said correlation variation*a correlation weight).

23. The method for determining an illumination source with optimized depth of focus of claim 15, wherein said peak weight +said correlation weight=1.

* * * * *